United States Patent
McKay et al.

(10) Patent No.: US 11,874,308 B2
(45) Date of Patent: Jan. 16, 2024

(54) ASIC IMPLEMENTING REAL-TIME SPECTRUM ANALYSIS

(71) Applicant: Keysight Technologies, Inc., Santa Rosa, CA (US)

(72) Inventors: Connor P. McKay, Colorado Springs, CO (US); Joseph D. Shaker, Colorado Springs, CO (US); Scott Allan Genther, Colorado Springs, CO (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

(21) Appl. No.: 17/878,249

(22) Filed: Aug. 1, 2022

(65) Prior Publication Data

US 2023/0138538 A1    May 4, 2023

Related U.S. Application Data

(60) Provisional application No. 63/273,387, filed on Oct. 29, 2021.

(51) Int. Cl.
  *G01R 23/16* (2006.01)
(52) U.S. Cl.
  CPC .................................. *G01R 23/16* (2013.01)
(58) Field of Classification Search
  CPC ................................ G01R 23/16; G01R 13/02
  USPC ...................... 324/76.22, 76.19, 76.12, 76.11
  See application file for complete search history.

(56) References Cited

U.S. PATENT DOCUMENTS

| | | |
|---|---|---|
| 6,377,617 B1 | 4/2002 | Nara |
| 8,489,350 B2 | 7/2013 | Engholm et al. |
| 9,170,286 B2 | 10/2015 | Bordow |
| 9,589,377 B1* | 3/2017 | Bordow ............. G01R 13/0272 |
| 10,371,732 B2* | 8/2019 | Al-Adnani ........... G01R 23/167 |
| 2023/0140131 A1* | 5/2023 | Holcomb ........... G01R 13/0272 |
| | | 702/77 |

FOREIGN PATENT DOCUMENTS

| | | |
|---|---|---|
| CN | 109725198 B | 3/2021 |
| JP | 3486016 B2 | 10/2003 |

OTHER PUBLICATIONS

Thomas C. Hill, "Real-Time Spectrum Analysis Reveals Time Domain Characteristics of Frequency Domain Signals", 72nd ARFTG Microwave Measurement Symposium, 2008, pp. 102-108.
English translation of abstract of CN109725198B, 1 pg.
English translation of abstract of JP3486016B2, 1 pg.

* cited by examiner

*Primary Examiner* — Giovanni Astacio-Oquendo

(57) ABSTRACT

A real-time spectrum analyzer (RTSA) includes an analog-to-digital converter (ADC) configured to convert in real-time an input analog signal into a digital input data stream, a digital down-converter (DDC) configured to down-convert in real-time the digital input data stream into a down-converted input data stream, a fast Fourier transform (FFT) unit configured to generate in real-time FFTs of the down-converted input data stream, an acquisition memory circuit configured to store in real-time the FFTs generated by the FFT unit, and an analyzer configured to read in non-real time the FFTs stored in the acquisition memory.

12 Claims, 5 Drawing Sheets

ASIC IMPLEMENTING REAL-TIME SPECTRUM ANALYSIS

CROSS-REFERENCE TO RELATED APPLICATIONS

The present application claims priority under 35 U.S.C. § 119(e) to U.S. Provisional Application No. 63/273,387 filed on Oct. 29, 2021. The entire disclosure of U.S. Provisional Application No. 63/273,387 is specifically incorporated herein by reference in its entirety.

BACKGROUND

When an oscilloscope is in real-time-spectrum-analysis (RTSA) mode, it continuously stores samples representing the measured waveform to an acquisition memory. A plotter then periodically reads these samples out of memory and plots frequency domain representations of the signal to a screen of the oscilloscope. Typically, these periodic reads are synced to the video frame rate of the scope. Since the plotter is idle for a brief period between these reads it must have higher processing bandwidth than the bandwidth of the data being stored to the acquisition memory so that the plotter can "catch up" to the acquisition. This may limit the maximum bandwidth of the RTSA.

SUMMARY

According to an aspect of the inventive concepts, a real-time spectrum analyzer (RTSA) includes an analog-to-digital converter (ADC) configured to convert in real-time an input analog signal into a digital input data stream, a digital down-converter (DDC) configured to down-convert in real-time the digital input data stream into a down-converted input data stream, a fast Fourier transform (FFT) unit configured to generate in real-time FFTs of the down-converted input data stream, an acquisition memory circuit configured to store in real-time the FFTs generated by the FFT unit, and an analyzer configured to read in non-real time the FFTs stored in the acquisition memory.

The analyzer may include a plotter configured to generate display data of a frequency domain representation of input analog signal.

Each FFT is determined by converting each group of time-domain samples from the DDC into a corresponding group of frequency-domain buckets, where each bucket represents an amplitude of the input analog signal at a given portion of a frequency spectrum. The number of frequency-domain buckets of each FFT may be any arbitrary number. In an example, the number of frequency-domain buckets of each FFT is $2^x$, where x is a positive integer. The group of frequency-domain buckets of each FFT may constitute a write packet unit into the acquisition memory.

The RTSA may be implemented as an application-specific-integrated-circuit (ASIC) or field programmable gate array (FPGA).

According to another aspect of the inventive concepts, a test instrument is provided that includes a real-time spectrum analyzer (RTSA) and a display. The RTSA includes an analog-to-digital converter (ADC) configured to convert in real-time an input analog signal into a digital input data stream, a digital down-converter (DDC) configured to down-convert in real-time the digital input data stream into a down-converted input data stream, a fast Fourier transform (FFT) unit configured to generate in real-time FFTs of the down-converted input data stream, an acquisition memory circuit configured to store in real-time the FFTs generated by the FFT unit, and an plotter configured to read in non-real time the FFTs stored in the acquisition memory and to generate display data for the display, the display data being a frequency domain representation of the input analog signal The test instrument may be an oscilloscope, and the RTSA may be implemented as an application-specific-integrated-circuit (ASIC) or field programmable gate array (FPGA) within the oscilloscope.

Each FFT is determined by converting each group of time-domain samples from the DDC into a corresponding group of frequency-domain buckets, where each bucket represents an amplitude of the input analog signal at a given portion of a frequency spectrum. The number of frequency-domain buckets of each FFT may be any arbitrary number. In an example, the number of frequency-domain buckets of each FFT is $2^x$, where x is a positive integer. The group of frequency-domain buckets of each FFT may constitute a write packet unit into the acquisition memory.

BRIEF DESCRIPTION OF THE DRAWINGS

The above and other aspects and features of the inventive concepts will become readily apparent from the detailed description that follows, with reference to the accompanying drawings, in which.

DETAILED DESCRIPTION

Figure 1:
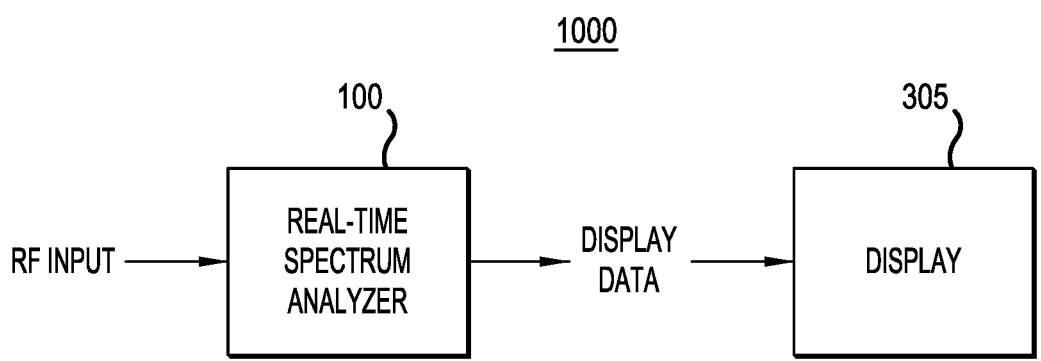
FIG. 1 is a circuit block diagram of a test instrument in accordance with embodiments of the inventive concepts.

Throughout the drawings, like reference numbers are given to like elements in the various embodiments. In addition, as the discussion below progresses from one embodiment to the next, a detailed description of already described elements common to previous embodiments is not repeated to avoid redundancy.

As is traditional in the field of the present disclosure, embodiments may be described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram of a measurement instrument 1000 in accordance with embodiments of the inventive concepts. The measurement instrument 1000 may, for example, be an oscilloscope.

Referring to FIG. 1, the measurement instrument 1000 includes a real-time-spectrum-analyzer (RTSA) 100 and a display 305. The RTSA 100 processes an input signal (e.g., a radio frequency (RF) signal) and transmits resulting display data in the form of an output data stream to the display 305. Generally, the RTSA 100 converts the input RF signal from a time domain to a frequency domain, and the output data stream of the RTSA 100 is a representation of the RF input signal in the frequency domain. This frequency domain representation of the RF input signal may be displayed on the display 305 or otherwise analyzed. The RTSA 100 may be implemented as an application-specific-integrated-circuit (ASIC) or field programmable gate array (FPGA) of the measurement instrument 1000.

Figure 2:
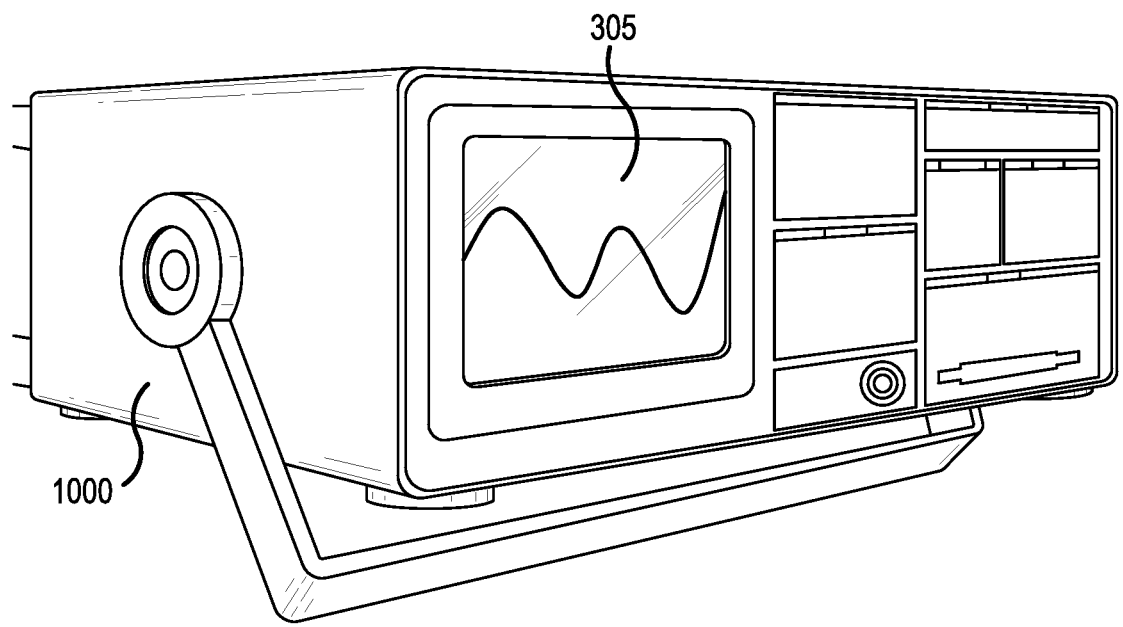
FIG. 2 is a perspective view of an oscilloscope in accordance with embodiments of the inventive concepts.

FIG. 2 is an exemplary perspective view of an oscilloscope which may constitute the measurement instrument 1000 of FIG. 1. During a typical operation of the oscilloscope 1000, a user applies an RF signal of a device or system under test (not shown) to an input port of the oscilloscope 1000. As one example, an output of the device or system under test may be coaxially coupled to an RF input of the oscilloscope, and the oscilloscope may then convert a signal at the output of the device or system under test to one or more waveforms to be displayed on a display(s) 305 of the oscilloscope 1000. As another example, a probe tip of an oscilloscope probe (not shown) may be place in contact with a test point of the device or system under test. Upon contacting the test point, the probe detects a signal at the test point and transmits the signal to the oscilloscope 1000. The oscilloscope 1000 then converts the signal into one or more waveforms to be displayed on a display 305 of the oscilloscope 1000.

In addition to the RTSA 100 which is the focus of the present disclosure, the oscilloscope 1000 may include a variety of other internal circuit components, input ports, output ports, control knobs, and display screens. Examples of internal circuit components include amplifiers, overdrive protection circuits, analog-to-digital converters, clamping circuits, frequency mixers, signal processors, volatile and nonvolatile memory, and so on.

Figure 3:
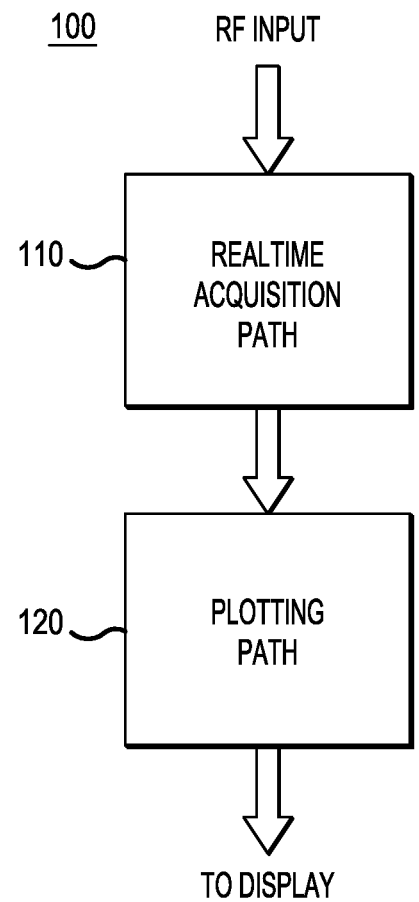
FIG. 3 is a circuit block diagram of a real-time-spectrum-analyzer (RTSA) in accordance with the embodiments of the inventive concepts.

FIG. 3 is a circuit block diagram which illustrates an RTSA 100 as generally including a real-time acquisition path 110 and a plotting path 120.

Generally speaking, and for purposes of explanation, a measurement instrument such as an oscilloscope may be considered as including an acquisition part and analysis part. The acquisition part carries out a high-speed capture process of the RF input signal in real-time, while the analysis part carries out a relatively low-speed analysis process of the capture signal. This is represented in FIG. 3 by the real-time acquisition path 110 which receives the RF input signal, and the plotting path 120 which receives data captured by the real-time acquisition path 110 and then process the received data to generate display data for display on the oscilloscope. In other words, the acquisition path 110 carries out essentially one continuous capture of the RF input signal. And then afterwards, that captured signal is read out and used for analysis and/or for plotting on a screen of the oscilloscope.

Figure 4:
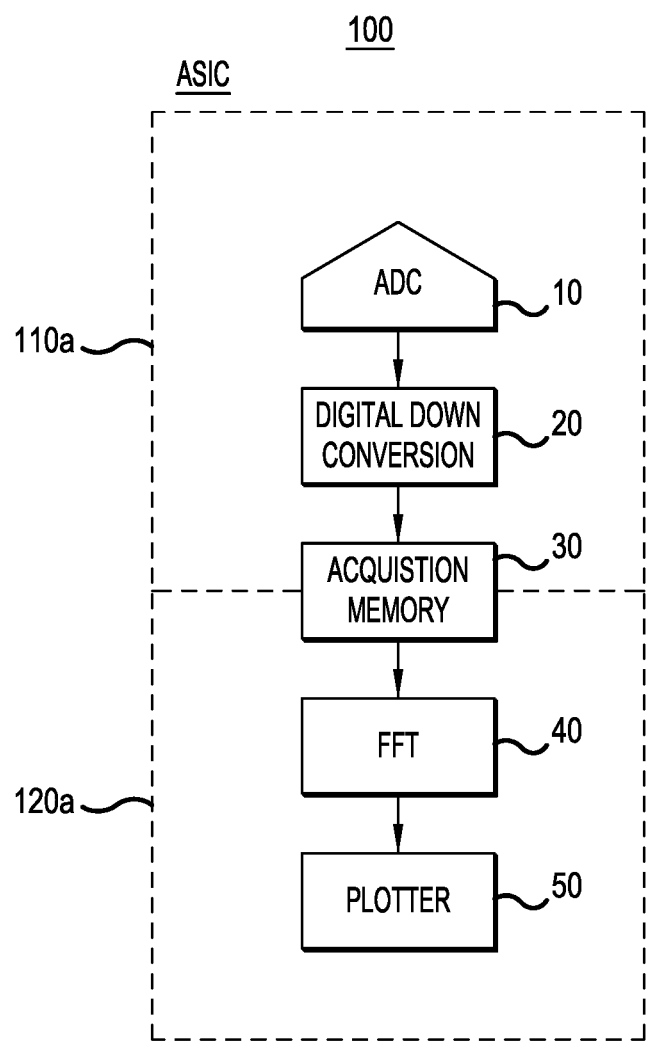
FIG. 4 is a circuit block diagram of a real-time-spectrum-analyzer (RTSA) in accordance with the related art.

FIG. 4 is a simplified block diagram of an application-specific-integrated-circuit (ASIC) or field programmable gate array (FPGA) 101 of the related art for an oscilloscope that is implemented with RTSA functionality. As shown, the ASIC 100 includes an analog-to-digital conversion (ADC) circuit 10, a digital down conversion (DDC) circuit 20, an acquisition memory 30, a fast fourier transform (FFT) circuit 40, and a plotter 50.

As shown FIG. 4, the ASIC or FPGA 101 of the related art includes a real-time acquisition path 110a and a plotting path 120a. As described above, the real-time acquisition path 110a receives the RF input signal, and the plotting path 120a receives data captured by the real-time acquisition path 110 and then process the received data to generate display data for display on the oscilloscope.

The real-time acquisition path 110a of the ASIC or FPGA 101 includes the ADC circuit 10, the DDC circuit 20, and the input/write circuitry of the acquisition memory. In operation, the ADC circuit 10 is configured to convert an input RF signal into a digital input data stream. The DDC circuit 20 is configured to receive the digital data stream output by the ADC circuit 10, and to down-convert in the received digital data stream into a down-converted input data stream. As those skilled in the art will understand, the DDC circuit 20 converts the input signal to a lower frequency digital signal at a lower sampling rate in order to simplify subsequent processing stages. The DDC process may, for example, preserve all the information in the frequency band of interest of the original signal. The input/write circuitry of the acquisition memory is configured to store the samples of down-converted input data stream from the DDC circuit 20.

The ADC circuit 10, the DDC 20, and the input/write circuitry of the acquisition memory 30 all operate in real-time to capture (store) a digital representation (time domain samples) of the RF input signal. In operation, this is a continuous and real-time high-speed capture process of the RF input signal.

Still referring to FIG. 4, the plotting path 120a includes the output/read circuitry of the acquisition memory 30, the FFT circuit 40, and the plotter 50. In operation, the captured data stored in the acquisition memory is read and output to the FFT circuit 40. The FFT circuit 40 is configured to compute the FFTs of the input RF signal from the time-domain data captured by the real-time acquisition path 110a. As one skilled in the art will understand, the FFTs are a frequency domain representation of the input RF signal. That is, each bucket in the FFT denotes an amplitude of the input RF signal at a given portion of a given frequency spectrum. The FFTs are supplied from the FFT circuit 40 to the plotter 50, and the plotter 50 is configured to generate corresponding display data of the frequency domain representation of the input RF signal.

The ASIC or FPGA 101 as configured in FIG. 4 suffers drawbacks. That is, as described above, when the oscilloscope is in real-time-spectrum-analysis (RTSA) mode, it continuously stores samples representing the measured waveform to the acquisition memory 30, and then periodically reads these samples out of the acquisition memory 30 and plots frequency domain representations of the signal to the display of the oscilloscope. Typically, these periodic reads are synced to the video frame rate of the oscilloscope. Because the plotter 50 is idle for a brief period between these reads it must have a higher processing bandwidth than the bandwidth of the data being stored to acquisition memory 30 so that the plotter 50 can "catch up" to the real-time acquisition. This limits the bandwidth of the RTSA by the available bandwidth of the FFT circuit 40. As an example, given an available FFT bandwidth of 1.6 giga-samples per second (GSa/s), the bandwidth of the RTSA may be limited to 0.8 GSa/s.

Further, even if the FFT circuit was somehow subsumed by the realtime acquisition path 110a its output would not be stored to memory. This would make it impossible to produce frequency-domain plots while using frequency-domain triggering, since the FFT block could not be switched back and forth while the oscilloscope was running A second FFT block would have to be added to the ASIC or FPGA to remove this limitation, but that would require more power and area.

Figure 5:
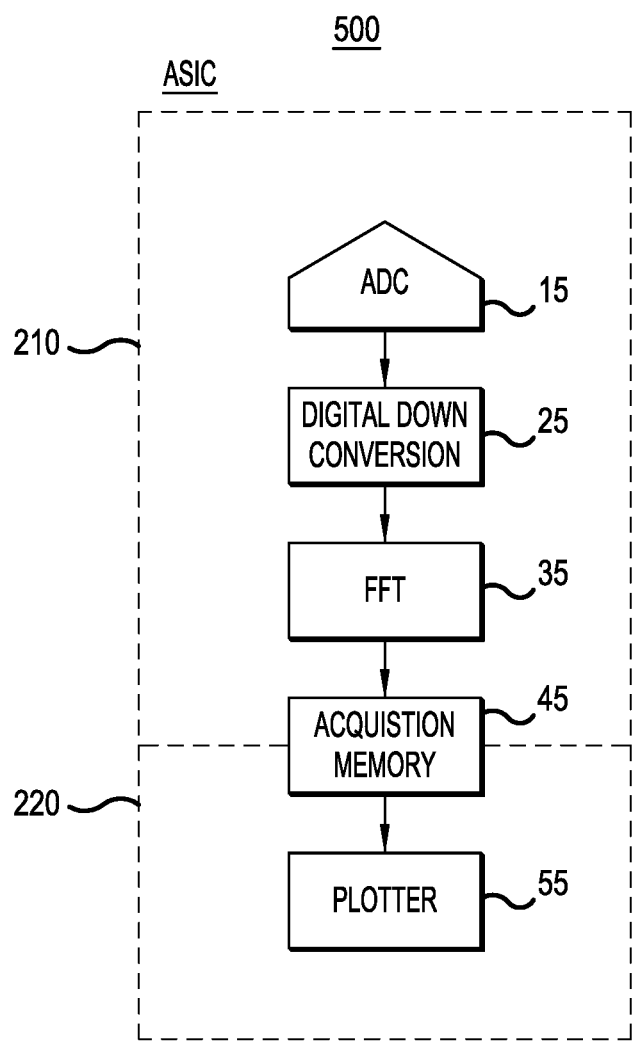
FIG. 5 a circuit block diagram of a real-time-spectrum-analyzer (RTSA) in accordance with the embodiments of the inventive concepts.

FIG. 5 is a circuit block diagram of an ASIC or FPGA 500 having RTSA functionality according to an embodiment of the inventive concepts. As shown, the ASIC or FPGA 500 includes an analog-to-digital conversion (ADC) circuit 15, a digital down conversion (DDC) circuit 25, a fast fourier transform (FFT) circuit 35, an acquisition memory 45, and a plotter 55.

As explained below, the embodiment of FIG. 5 is characterized by placing the FFT circuit 35 in the real-time acquisition path of the ASIC or FPGA 500, and storing resulting frequency domain representations of the signal in the acquisition memory 45. This eliminates the extra bandwidth required of the FFT circuit relative to the bandwidth of the RTSA. For example, given the previous example of an available FFT bandwidth of 1.6 GSa/s, the bandwidth of the RTSA could be 1.6 GSa/s (which is double that of the example of FIG. 4).

Referring to FIG. 5, the ASIC or FPGA 500 includes a real-time acquisition path 210 and a plotting path 220.

The real-time acquisition path 210 of the ASIC or FPGA 500 includes the ADC circuit 15, the DDC circuit 25, the FFT circuit 35, and the input/write circuitry of the acquisition memory 45. In operation, the ADC circuit 15 is configured to convert an input RF signal into a digital input data stream. The DDC circuit 25 is configured to receive the digital data stream output by the ADC circuit 15, and to down-convert in the received digital data stream into a down-converted input data stream. As discussed previously, the DDC circuit 25 converts the input signal to a lower frequency digital signal at a lower sampling rate in order to simplify subsequent processing stages. The samples of down-converted input data generated by the DDC circuit 25 are applied in real-time as inputs to the FFT circuit 35. The FFT circuit 40 is configured to compute the FFTs of the input RF signal from the time-domain data output by the DDC 25. As mentioned before, the FFTs are a frequency domain representation of the input RF signal. That is, each FFT denotes an amplitude of the input RF signal at a given portion of a given frequency spectrum. Still in real-time, the FFTs computed by the FFT circuit 35 are applied to input/write circuitry of the acquisition memory 45 for storage in the acquisition memory 45.

The ADC circuit 15, the DDC circuit 25, the FFT circuit 35, and the input/write circuitry of the acquisition memory 45 all operate in real-time to compute and capture (store) a frequency domain representation of the RF input signal. In operation, this is a continuous and real-time high-speed computation and capture process of the FFTs of the RF input signal.

Still referring to FIG. 5, the plotting path 200 includes the output/read circuitry of the acquisition memory 30, and the plotter 50. In operation, the computed and captured FFTs stored in the acquisition memory 45 are read and output to the to the plotter 50, and the plotter 50 is configured to generate corresponding display data of the frequency domain representation of the input RF signal.

The number of time-domain samples and the number of FFTs resulting from the FFT computations may be any arbitrary number. As an example, however, each FFT is calculated from $2^x$ time-domain samples, which are converted into $2^x$ frequency-domain buckets, where each bucket represents the amplitude of the signal within its portion of the spectrum. These $2^x$ discrete values may be treated as a single very large packet. The acquisition memory 45 and read control logic ensure that FFTs are always read out beginning on the boundary between two packets. Here, x is an integer, and may be on the order of 11 or more. For example, in the case where x is 11, each FFT may be calculated from 2048 time-domain samples, which are converted into 2048 frequency-domain buckets. The inventive concepts are not limited by these numerical examples.

It should also be noted that the inventive concepts encompass embodiments in which the FFTs that are computed and plotted with some amount of overlap, i.e., in N point FFT with M samples of overlap will first take an FFT of samples [0, N), then [N–M, 2N–M), [2(N–M), 2(N–M)+N), etc. Taking overlapping FFTs can help make a more useful measurement, but it also requires the FFT to run faster than the DDC. Some systems can be optimized to take FFTs with larger overlaps when the DDC is configured to decimate by more—so a user to can get more overlapped FFTs of a narrower frequency domain slice, or less overlapped FFTs of a wider frequency domain slice. This may require some additional processing, such as passing metadata to the plotter in order to understand the manner in which these FFTs are placed.

As mentioned above, by placing the FFT circuit 35 in the real-time acquisition path 210 of the ASIC or FPGA 500, and by storing resulting frequency domain representations of the signal in the acquisition memory 45, the extra bandwidth required of the FFT circuit relative to the bandwidth of the RTSA is eliminated.

In addition, because the FFTs are stored in memory, it is also possible to implement frequency domain triggers in the acquisition path using the output of the FFT while simultaneously making frequency domain plots from the stored FFT data.

In this respect, it is noted that in triggered modes (non-RTSA), the trigger and marking system must also account for these $2^x$-sample packets, and the readout logic must be able to calculate which FFT contains the trigger event so that it can be plotted on screen. This requires the horizontal time calculation logic to be capable of handling packets that represent very large timespans, since in narrow-bandwidth applications a single FFT could cover multiple seconds of time.

While the embodiments described above implement the RTSA by an ASIC or FPGA, the inventive concepts are not limited in this manner Instead, the components of the RTSA can be configured separately within the measurement instrument. Further, in the embodiments describe above, the analyzer is a plotter for display. Again, however, the analyzer is not limited in this fashion and can instead, for example, be implemented as a digital analyzer or the like.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A real-time spectrum analyzer (RTSA), comprising:
 analog-to-digital converter (ADC) configured to convert in real-time an input analog signal into a digital input data stream;
 a digital down-converter (DDC) configured to down-convert in real-time the digital input data stream into a down-converted input data stream;
 a fast Fourier transform (FFT) unit configured to generate in real-time FFTs of the down-converted input data stream;
 an acquisition memory circuit configured to store in real-time the FFTs generated by the FFT unit; and
 an analyzer configured to read in non-real time the FFTs stored in the acquisition memory.

2. The RTSA of claim 1, wherein the analyzer includes a plotter configured to generate display data of a frequency domain representation of input analog signal.

3. The RTSA of claim 1, wherein each FFT is determined by converting each group of time-domain samples from the DDC into a corresponding group of frequency-domain buckets, where each bucket represents an amplitude of the input analog signal at a given portion of a frequency spectrum.

4. The RTSA of claim 3, wherein each group of frequency-domain buckets constitutes a write packet unit into the acquisition memory.

5. The RTSA of claim 4, wherein a number of frequency domain buckets of each FFT is $2^x$, where x is a positive integer.

6. The RTSA of claim 5, wherein x is at least 11.

7. The RTSA of claim 1, wherein the RTSA is implemented as an application-specific-integrated-circuit (ASIC) or field programmable gate array (FPGA).

8. The test instrument of claim 7, wherein each FFT is determined by converting each group of time-domain samples from the DDC into a corresponding group of frequency-domain buckets, where each bucket represents an amplitude of the input analog signal at a given portion of a frequency spectrum.

9. The test instrument of claim 8, wherein each group of frequency-domain buckets constitutes a write packet unit into the acquisition memory.

10. A test instrument, comprising a real-time spectrum analyzer (RTSA) and a display, wherein the RTSA comprises:
 analog-to-digital converter (ADC) configured to convert in real-time an input analog signal into a digital input data stream;
 a digital down-converter (DDC) configured to down-convert in real-time the digital input data stream into a down-converted input data stream;
 a fast Fourier transform (FFT) unit configured to generate in real-time FFTs of the down-converted input data stream;
 an acquisition memory circuit configured to store in real-time the FFTs generated by the FFT unit; and
 an plotter configured to read in non-real time the FFTs stored in the acquisition memory and to generate display data for the display, the display data being a frequency domain representation of the input analog signal.

11. The test instrument of claim 10, wherein the test instrument is an oscilloscope.

12. The test instrument of claim 11, wherein the RTSA is implemented as an application-specific-integrated-circuit (ASIC) or field programmable gate array (FPGA) within the oscilloscope.

* * * * *